(12) United States Patent
Shikauchi et al.

(10) Patent No.: US 9,966,259 B2
(45) Date of Patent: May 8, 2018

(54) SILICON-BASED SUBSTRATE, SEMICONDUCTOR DEVICE, AND METHOD FOR MANUFACTURING SEMICONDUCTOR DEVICE

(71) Applicants: SANKEN ELECTRIC CO., LTD, Niiza-shi, Saitama (JP); SHIN-ETSU HANDOTAI CO. LTD., Tokyo (JP)

(72) Inventors: Hiroshi Shikauchi, Niiza (JP); Ken Sato, Miyoshi-machi (JP); Hirokazu Goto, Minato-ku (JP); Masaru Shinomiya, Annaka (JP); Keitaro Tsuchiya, Takasaki (JP); Kazunori Hagimoto, Takasaki (JP)

(73) Assignees: SHANKEN ELECTRIC CO., LTD., Niiza (JP); SHIN-ETSU HANDOTAI CO., LTD., Tokyo (JP)

( * ) Notice: Subject to any disclaimer, the term of this patent is extended or adjusted under 35 U.S.C. 154(b) by 0 days. days.

(21) Appl. No.: 15/585,518

(22) Filed: May 3, 2017

(65) Prior Publication Data
US 2017/0236711 A1    Aug. 17, 2017

Related U.S. Application Data

(62) Division of application No. 14/892,373, filed as application No. PCT/JP2014/002405 on May 2, 2014, now Pat. No. 9,673,052.

(30) Foreign Application Priority Data

May 31, 2013 (JP) .................... 2013-116208

(51) Int. Cl.
  *H01L 21/02* (2006.01)
  *H01L 29/36* (2006.01)
  (Continued)

(52) U.S. Cl.
  CPC ...... *H01L 21/02658* (2013.01); *C30B 25/186* (2013.01); *C30B 29/06* (2013.01);
  (Continued)

(58) Field of Classification Search
  CPC ..... C30B 25/186; C30B 29/06; C30B 29/403; C30B 23/025; C30B 25/18;
  (Continued)

(56) References Cited

U.S. PATENT DOCUMENTS 3,249,831 A    5/1966  New et al.
8,536,616 B2   9/2013  Chang et al.
(Continued)

FOREIGN PATENT DOCUMENTS

CN    1590600 A    3/2005
CN  101802273 A    8/2010
(Continued)

OTHER PUBLICATIONS

Aug. 19, 2014 International Search Report issued in International Patent Application No. PCT/JP2014/002405.
(Continued)

*Primary Examiner* — Bac Au
(74) *Attorney, Agent, or Firm* — Oliff PLC (57) ABSTRACT

A silicon-based substrate on which a nitride compound semiconductor layer is formed on a front surface thereof, including a first portion provided on the front surface side which has a first impurity concentration and a second portion provided on an inner side of the first portion which has a second impurity concentration higher than the first impurity concentration, wherein the first impurity concentration being $1\times10^{14}$ atoms/cm$^3$ or more and less than $1\times10^{19}$ atoms/cm$^3$. Consequently, there is provided the silicon-based substrate in which the crystallinity of the nitride compound semiconductor layer formed on an upper side
(Continued)

thereof can be maintained excellently while improving a warpage of the substrate.

8 Claims, 4 Drawing Sheets

(51) Int. Cl.
    *H01L 21/225*     (2006.01)
    *C30B 25/18*     (2006.01)
    *C30B 29/06*     (2006.01)
    *C30B 29/40*     (2006.01)
    *H01L 29/778*     (2006.01)
    *H01L 29/66*     (2006.01)

(52) U.S. Cl.
    CPC ........ *C30B 29/403* (2013.01); *H01L 21/0245* (2013.01); *H01L 21/0254* (2013.01); *H01L 21/0259* (2013.01); *H01L 21/02381* (2013.01); *H01L 21/2251* (2013.01); *H01L 29/36* (2013.01); *H01L 21/02595* (2013.01); *H01L 21/02598* (2013.01); *H01L 29/66462* (2013.01); *H01L 29/7786* (2013.01)

(58) Field of Classification Search
    CPC .......... H01L 21/02381; H01L 21/0254; H01L 21/2251; H01L 29/36; H01L 29/66462; H01L 29/7786; H01L 21/2258; H01L 21/0245; H01L 21/0259; H01L 21/02595; H01L 21/02598; H01L 21/02658
    See application file for complete search history.

(56) References Cited

U.S. PATENT DOCUMENTS

| | | |
|---|---|---|
| 9,110,348 B2 | 8/2015 | Goi et al. |
| 2002/0179910 A1 | 12/2002 | Slater |
| 2004/0053326 A1 | 3/2004 | Emmert-Buck et al. |
| 2005/0048685 A1 | 3/2005 | Shibata |
| 2008/0227275 A1 | 9/2008 | Seng et al. |
| 2009/0009935 A1 | 1/2009 | Hsu et al. |
| 2009/0032997 A1 | 2/2009 | Hiratsuka |
| 2009/0162996 A1 | 6/2009 | Ramaswamy et al. |
| 2010/0032653 A1 | 2/2010 | Takeda et al. |
| 2011/0006309 A1 | 1/2011 | Momose et al. |
| 2011/0089967 A1 | 4/2011 | Kim |
| 2011/0298009 A1 | 12/2011 | Ikuta et al. |
| 2012/0098036 A1 | 4/2012 | Bahl et al. |
| 2015/0069407 A1 | 3/2015 | Matsubayashi et al. |

FOREIGN PATENT DOCUMENTS

| | | |
|---|---|---|
| CN | 101903981 A | 12/2010 |
| JP | H03-80200 A | 4/1991 |
| JP | H05-18935 A | 1/1993 |
| JP | 2713310 B2 | 2/1998 |
| JP | 2000-174034 A | 6/2000 |
| JP | 2005-158846 A | 6/2005 |
| JP | 2010-153817 A | 7/2010 |
| JP | 2011-103380 A | 5/2011 |
| JP | 2012-051774 A | 3/2012 |
| JP | 2012-066943 A | 4/2012 |
| JP | 2013-084913 A | 5/2013 |

OTHER PUBLICATIONS

Dec. 1, 2015 International Preliminary Report on Patentability issued in International Patent Application No. PCT/JP2014/002405.
Jul. 13, 2016 Office Action issued in Taiwanese Patent Application No. 103117346.
Aug. 30, 2016 Office Action issued in Japanese Patent Application No. 2013-116208.
Mar. 14, 2017 Office Action issued in Japanese Application No. 2013-116208.
Feb. 24, 2017 Office Action issued in Chinese Application No. 201480021035.
Feb. 3, 2017 Notice of Allowance issued in U.S. Appl. No. 14/892,373.
Oct. 18, 2017 Office Action issued in Chinese Patent Application No. 201480031035.X.
Oct. 18, 2017 Supplementary Search Report issued in Chinese Patent Application No. 201480031035.X.

SILICON-BASED SUBSTRATE, SEMICONDUCTOR DEVICE, AND METHOD FOR MANUFACTURING SEMICONDUCTOR DEVICE

This is a Divisional of application Ser. No. 14/892,373 filed Nov. 19, 2015, which is a National Stage Application of PCT/JP2014/002405 filed May 2, 2014. The entire disclosures of the prior applications are hereby incorporated by reference herein in their entirety.

BACKGROUND OF THE INVENTION

1. Field of the Invention

Technical Field

The present invention relates to a silicon-based substrate, a semiconductor device, and a method for manufacturing a semiconductor device, and more particularly to a silicon-based substrate on which a nitride compound semiconductor layer is formed, a semiconductor device using this silicon-based substrate, and a method for manufacturing this semiconductor device.

2. Description of the Related Art

A nitride compound semiconductor layer is generally famed on an inexpensive silicon substrate or a sapphire substrate, but slips or defects are introduced into the silicon substrate by stress applied to the silicon substrate in a process of thickly growing a group III nitride semiconductor layer on the silicon substrate. Consequently, there occurs a problem that a warpage of the fabricated substrate is not stabilized due to these slips or defects.

As means for solving this problem of the warpage of the substrate, there is a method for increasing a thickness of the silicon substrate. However, a thickness of a generally fabricable substrate is approximately 1 mm. Fabrication of a substrate having a larger thickness is difficult due to limitations of an device, a jig, or the like used in a fabrication process of the substrate or a manufacturing line for fabricating a device.

As another means, enhancing strength of the silicon substrate can be considered. As this method, there has been reported that the strength of the silicon substrate is enhanced by setting boron concentration in the silicon substrate to, e.g., $1 \times 10^{19}$ atoms/cm$^3$ or more (see Patent Literature 1).

Further, Patent Literature 2 discloses that a warpage of a silicon substrate is reduced by controlling oxygen concentration in the silicon substrate.

CITATION LIST

Patent Literatures

Patent Literature 1: Japanese Unexamined Patent Application Publication No. 2010-153817
Patent Literature 2: Japanese Unexamined Patent Application Publication No. 2011-103380

SUMMARY OF THE INVENTION

As described above, improving a warpage of a substrate having a nitride compound semiconductor layer formed thereon has been suggested.

However, the present inventors have found out the following problems.

That is, increasing boron concentration in a silicon substrate as disclosed in Patent Literature 1, results in occurrence of a problem that crystallinity of a nitride compound semiconductor layer grown on the silicon substrate is degraded.

Figure 3:
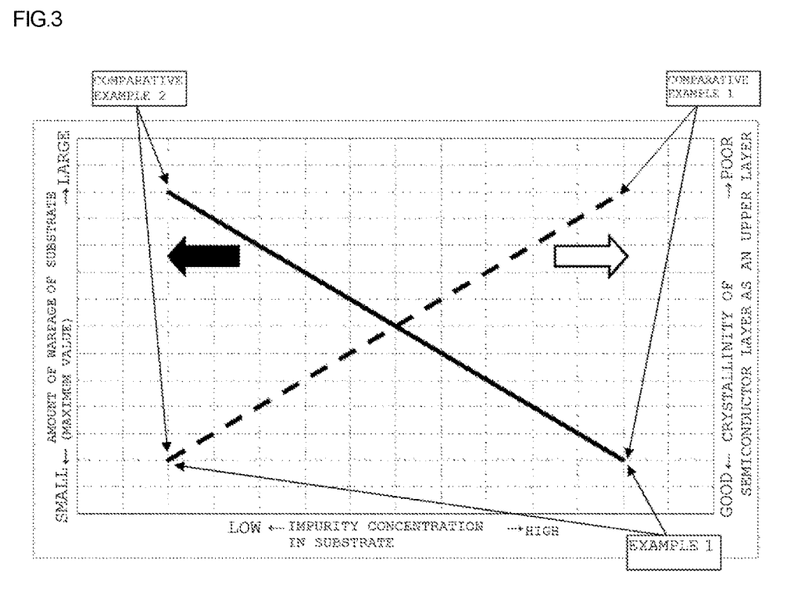
FIG. 3 is a graph showing a relationship between an amount of warpage of the substrate and impurity concentration in the substrate, and a relationship between crystallinity of a semiconductor layer as an upper layer and impurity concentration in the substrate.

FIG. 3 is a graph showing a relationship between an amount of warpage (a maximum value) of the substrate and impurity concentration in the substrate, and a relationship between crystallinity of the nitride compound semiconductor layer as an upper layer and impurity concentration in the substrate. As shown in FIG. 3, the amount of warpage (the maximum value) of the substrate and the crystallinity of the nitride compound semiconductor layer as the upper layer show opposite characteristics with respect to the impurity concentration in the substrate.

That is, when the impurity concentration in the substrate is increased, the amount of warpage (the maximum value) of the substrate is reduced, but, on the other hand, the crystallinity of the nitride compound semiconductor layer as the upper layer is degraded. In contrast, when the impurity concentration in the substrate is lowered, the crystallinity of the nitride compound semiconductor layer as the upper layer is improved, but, on the other hand, the amount of warpage (the maximum value) of the substrate is increased.

Moreover, when controlling the oxygen concentration in the silicon substrate is tried as disclosed in Patent Literature 2, the silicon substrate having oxygen concentration in a predetermined range must be used, a problem of a high material cost arises, and an improvement of the warpage in this method is insufficient.

In view of the above-described problem, it is an object of the present invention to provide a silicon-based substrate in which crystallinity of a nitride compound semiconductor layer formed on the upper side thereof can be maintained excellently while improving a warpage of the substrate, a semiconductor device using the silicon-based substrate, and a method of manufacturing the semiconductor device.

To achieve this object, the present invention provides a silicon-based substrate on which a nitride compound semiconductor layer is formed on a front surface thereof, including: a first portion provided on a front surface side, which has a first impurity concentration; and a second portion provided on an inner side of the first portion, which has a second impurity concentration higher than the first impurity concentration, wherein the first impurity concentration is $1 \times 10^{14}$ atoms/cm$^3$ or more and less than $1 \times 10^{19}$ atoms/cm$^3$.

As described above, when the first portion of the silicon-based substrate on the front surface side has the lower impurity concentration than the second portion of the silicon-based substrate on the inner side and the impurity concentration in this first portion is $1 \times 10^{14}$ atoms/cm$^3$ or more and less than $1 \times 10^{19}$ atoms/cm$^3$, the crystallinity of the nitride compound semiconductor layer formed on the upper side thereof, can be excellently maintained, and since the second portion provided on the inner side has the high impurity concentration, a warpage of the silicon-based substrate that occurs when the nitride compound semiconductor layer is formed, can be improved.

Here, it is preferable that the second impurity concentration is $1 \times 10^{19}$ atoms/cm$^3$ or more and $1 \times 10^{20}$ atoms/cm$^3$ or less.

As described above, when impurity concentration of the second portion of the silicon-based substrate on the inner side is $1 \times 10^{19}$ atoms/cm$^3$ or more and $1 \times 10^{20}$ atoms/cm$^3$ or less, the warpage of the silicon-based substrate can be more effectively improved.

Furthermore, it is preferable that a thickness of the first portion is 1 μm or more and 10 μm or less, and that the thickness of the first portion is smaller than a thickness of the second portion.

As described above, if the thickness of the first portion of the silicon-based substrate on the front surface side is 1 μm or more and 10 μm or less, even when the nitride compound semiconductor layer is formed on the upper side thereof, since the impurity concentration in the silicon-based substrate surface is not increased by diffusion of the impurity from the second portion of the silicon-based substrate on the inner side, the crystallinity of the nitride compound semiconductor layer famed on the upper side thereof can be assuredly improved.

Moreover, when the thickness of the first portion is smaller than the thickness of the second portion, the thickness of the second portion can be sufficiently assured, and the warpage of the silicon-based substrate can be securely improved.

Here, the impurity can be any one or more of boron, phosphorous, aluminum, gallium, arsenic, nitrogen, oxygen, and carbon.

As the impurity doped in the silicon-based substrate, the above-described element can be preferably used, and the strength of the substrate can be assuredly improved.

Further, to achieve the above object, there is provided a semiconductor device including: a silicon-based substrate having a first portion provided on a front surface side which has a first impurity concentration and a second portion provided on an inner side of the first portion which has a second impurity concentration higher than the first impurity concentration; a nitride compound semiconductor layer famed in contact with a front surface of the silicon-based substrate; and an electrode famed on a surface of the nitride semiconductor layer which is on the opposite side of the silicon-based substrate, wherein the first portion has a thickness of 1 μm or more and 10 μm or less, the first impurity concentration is gradually reduced toward the front surface, and the first impurity concentration in the front surface of the silicon-based substrate is $1 \times 10^{14}$ atoms/cm$^3$ or more and less than $1 \times 10^{19}$ atoms/cm$^3$.

As described above, when the first portion of the silicon-based substrate on the front surface side has the lower impurity concentration than the second portion of the silicon-based substrate on the inner side, this first portion has the thickness that is 1 μm or more and 10 μm or less, the impurity concentration in this first portion is gradually reduced toward the front surface, and the impurity concentration in this first portion is $1 \times 10^{14}$ atoms/cm$^3$ or more and less than $1 \times 10^{19}$ atoms/cm$^3$, the crystallinity of the nitride compound semiconductor layer famed on the upper side can be excellently maintained, the second portion provided on the inner side has the high impurity concentration, and hence the warpage of the silicon-based substrate that occurs at the time of forming the nitride compound semiconductor layer can be improved.

Here, it is preferable for the second impurity concentration to be $1 \times 10^{19}$ atoms/cm$^3$ or more and $1 \times 10^{20}$ atoms/cm$^3$ or less.

As described above, when impurity concentration of the second portion of the silicon-based substrate on the inner side is $1 \times 10^{19}$ atoms/cm$^3$ or more and $1 \times 10^{20}$ atoms/cm$^3$ or less, the strength of the substrate can be more assuredly improved, and the warpage of the silicon-based substrate can be more effectively improved.

Furthermore, the impurity can be any one or more of boron, phosphorous, aluminum, gallium, arsenic, nitrogen, oxygen, and carbon.

As the impurity doped in the silicon-based substrate, the above-described element can be preferably used.

Moreover, to achieve the above object, there is provided a method for manufacturing a semiconductor device, including: fabricating a silicon-based substrate having a first portion provided on a front surface side which has a first impurity concentration and a second portion provided on an inner side of the first portion which has a second impurity concentration higher than the first impurity concentration, the first impurity concentration being $1 \times 10^{14}$ atoms/cm$^3$ or more and less than $1 \times 10^{19}$ atoms/cm$^3$, and a thickness of the second portion being larger than a thickness of the first portion; and forming a nitride semiconductor layer which is on the front surface of the silicon-based substrate.

According to the above-described method, the semiconductor device according to the present invention can be manufactured. In particular, since the step of forming the nitride semiconductor layer which is on the front surface of the silicon-based substrate is included, the impurity is thermally diffused into the first portion of the silicon-based substrate on the front surface side from the second portion of the silicon-based substrate on the inner side by a thermal history at the time of forming the nitride semiconductor layer, and hence the first impurity concentration is gradually reduced toward the front surface.

Here, it is preferable that the second impurity concentration is set to be $1 \times 10^{19}$ atoms/cm$^3$ or more and $1 \times 10^{20}$ atoms/cm$^3$ or less.

As described above, when the second portion of the silicon-based substrate on the inner side is set to be $1 \times 10^{19}$ atoms/cm$^3$ or more and $1 \times 10^{20}$ atoms/cm$^3$ or less, the substrate strength can be more assuredly enhanced, and the warpage of the silicon-based substrate can be more effectively improved.

Further, the step of fabricating the silicon-based substrate can include: a stage of preparing the silicon-based substrate having the second impurity concentration as a whole; and a stage of forming a silicon-based semiconductor layer having the first impurity concentration on the silicon-based substrate by epitaxial growth.

The above-described method enables preferably fabricating the silicon-based substrate having the first portion provided on the front surface side having the first impurity concentration and the second portion provided on the inner side having the second impurity concentration.

Furthermore, the step of fabricating the silicon-based substrate can include: a stage of preparing the silicon-based substrate having the second impurity concentration as a whole; and a stage of giving a thermal treatment to the silicon-based substrate to outwardly diffuse an impurity in a substrate surface.

The above-described method enables preferably fabricating the silicon-based substrate having the first portion provided on the front surface side having the first impurity concentration and the second portion provided on the inner side having the second impurity concentration.

Moreover, it is preferable that a thickness of the first portion is set to be 1 μm or more and 10 μm or less.

When the thickness of the first portion of the silicon-based substrate on the front surface side is set to be 1 μm or more and 10 μm or less in this manner, since the impurity concentration in the surface of the silicon-based substrate is not increased by thermal diffusion of the impurity from the second portion provided on the inner side of the silicon-based substrate at the time of forming the nitride compound semiconductor layer, the crystallinity of the nitride compound semiconductor layer can be assuredly improved.

Here, it is preferable to use any one or more of boron, phosphorous, aluminum, gallium, arsenic, nitrogen, oxygen, and carbon as the impurity.

As the impurity doped in the silicon-based substrate, the above-described element can be preferably used.

As described above, according to the present invention, it is possible to provide the silicon-based substrate in which the crystallinity of the nitride compound semiconductor layer famed on the upper side can be maintained excellently while improving the warpage of the substrate, the semiconductor device using this substrate, and the method for manufacturing the semiconductor device.

DETAILED DESCRIPTION OF THE PREFERRED EMBODIMENTS

The present invention will now be described in detail as an embodiment with reference to the drawings, but the present invention is not restricted thereto.

As described above, when boron concentration in a silicon substrate is increased to improve a warpage of a silicon substrate, there occurs a problem that crystallinity of a nitride compound semiconductor layer grown on the silicon substrate is degraded.

Thus, the present inventors repeatedly conducted keen investigations about a silicon-based substrate in which the crystallinity of a nitride compound semiconductor layer formed as an upper layer thereof can be maintained excellently while improving a warpage of the substrate.

Consequently, the present inventors have found out that, when impurity concentration in a first portion of the silicon-based substrate on a front surface side is set to be lower than impurity concentration in a second portion of the silicon-based substrate on an inner side and the impurity concentration in this first portion is set to be $1 \times 10^{14}$ atoms/cm$^3$ or more and less than $1 \times 10^{19}$ atoms/cm$^3$, the crystallinity of the nitride compound semiconductor layer formed as the upper layer can be maintained excellently and a warpage of the silicon-based substrate that occurs during formation of the nitride compound semiconductor layer, can be improved since the second portion provided on the inner side has the high impurity concentration, thereby bringing the present invention to completion.

Figure 1:
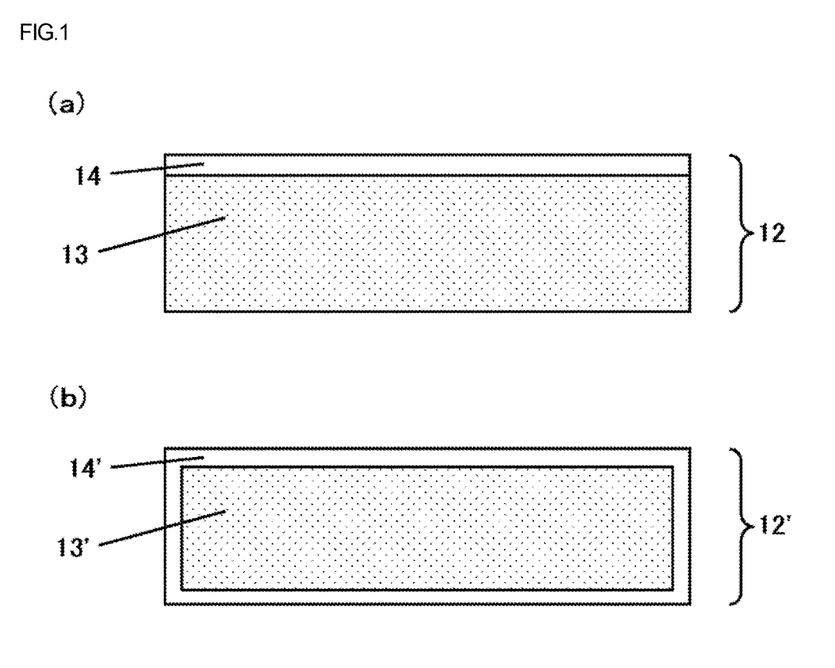
FIG. 1 is a schematic cross-sectional view showing an embodiment of a silicon-based substrate according to the present invention.

FIG. 1 is a schematic cross-sectional view showing an example of the silicon-based substrate.

FIG. 1(a) shows a silicon-based substrate famed by epitaxially growing a silicon-based semiconductor layer having first impurity concentration on the silicon-based substrate having second impurity concentration as a whole.

FIG. 1(b) shows a silicon-based substrate formed by giving a thermal treatment to a silicon-based substrate having the second impurity concentration as a whole to outwardly diffuse an impurity in a substrate surface.

The silicon-based substrate shown in FIG. 1(a) will be first described.

As shown in FIG. 1(a), a silicon-based substrate 12 has a first portion 14 on a front surface side thereof and a second portion 13 on an inner side of the first portion 14. The first portion 14 is provided on only one surface side (an upper surface side in the drawing: that is, a side where a nitride compound semiconductor layer is formed) of the silicon-based substrate 12.

Here, the silicon-based substrate 12 is made of, e.g., Si or SiC.

The impurity concentration in the first portion 14 is $1 \times 10^{14}$ atoms/cm$^3$ or more and less than $1 \times 10^{19}$ atoms/cm$^3$.

If the impurity concentration is less than $1 \times 10^{19}$ atoms/cm$^3$, the crystallinity of the nitride compound semiconductor layer formed on an upper side of the silicon-based substrate can be excellently maintained.

Further, if the impurity concentration is $1 \times 10^{14}$ atoms/cm$^3$ or more, the impurity concentration can be easily controlled.

The impurity concentration in the first portion 14 is lower than the impurity concentration in the second portion 13. That is, the impurity concentration in the second portion 13 is higher than the impurity concentration in the first portion 14. Consequently, strength of the silicon-based substrate 12 can be raised, and the warpage of the silicon-based substrate 12 can be reduced.

It is preferable for the impurity concentration of the second portion 13 to be $1 \times 10^{19}$ atoms/cm$^3$ or more and $1 \times 10^{20}$ atoms/cm$^3$ or less. When the impurity concentration is $1 \times 10^{19}$ atoms/cm$^3$ or more, the warpage of the silicon-based substrate can be more effectively improved. Furthermore, when the impurity concentration is $1 \times 10^{20}$ atoms/cm$^3$ or less, the crystallinity of the silicon-based substrate 12 can be excellently maintained, and the crystallinity of the nitride compound semiconductor layer formed on the upper side of the silicon-based substrate can be thereby excellently maintained.

Moreover, it is preferable that a thickness of the first portion 14 is 1 μm or more and 10 μm or less and the thickness of the first portion 14 is smaller than a thickness of the second portion 13.

If the thickness of the first portion 14 is 1 μm or more, since the impurity concentration of the silicon-based substrate surface is not increased by diffusion of the impurity from the second portion of the silicon-based substrate on the inner side even when the nitride compound semiconductor layer is formed on the upper side of the silicon-based substrate, the crystallinity of the nitride compound semiconductor layer famed on the upper side of the silicon-based substrate can be assuredly improved.

Moreover, if the thickness of the first portion 14 is 10 μm or less, the thickness of the silicon-based substrate 12 is not increased beyond necessity.

Additionally, if the thickness of the first portion 14 is smaller than the thickness of the second portion 13, the warpage of the silicon-based substrate can be assuredly improved.

Here, the impurity doped in the silicon-based substrate 12 can be, e.g., at least one or more of boron, phosphorous, aluminum, gallium, arsenic, nitrogen, oxygen, and carbon.

As the impurity doped in the silicon-based substrate 12, the above-described elements can be preferably used.

The silicon-based substrate in FIG. 1(b) will now be described.

A silicon-based substrate 12' shown in FIG. 1(b) is similar to the silicon-based substrate 12 shown in FIG. 1(a), but a difference lies in that a first portion 14' on a front surface side is provided on an entire surface (i.e., an upper surface, a lower surface, and a side surface) of the silicon-based substrate 12'.

That is because the first portion 14' is formed by out diffusion using a thermal treatment. Further, a bulk portion of the substrate becomes a second portion 13'.

A semiconductor device using the silicon-based substrate according to the present invention will now be described.

Figure 2:
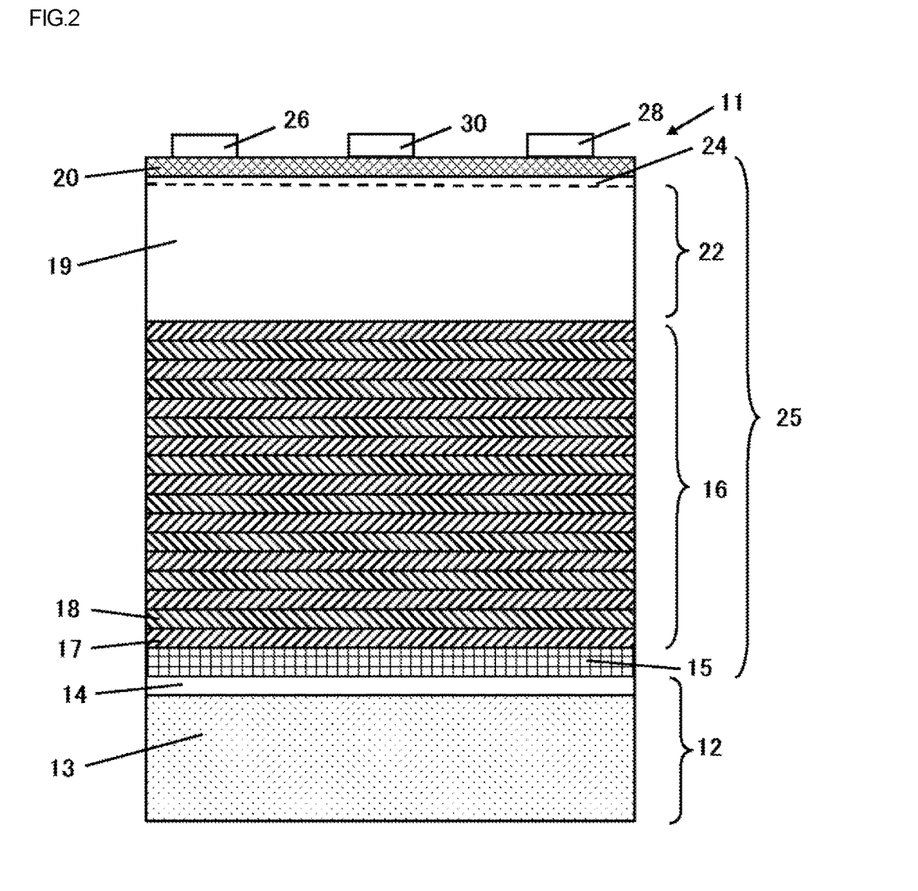
FIG. 2 is a schematic cross-sectional view showing an embodiment of a semiconductor device according to the present invention.

FIG. 2 is a schematic cross-sectional view showing an example of a semiconductor device according to the present invention.

A semiconductor device 11 according to the present invention shown in FIG. 2 includes the silicon-based substrate 12 shown in FIG. 1(a), an initial layer 15 provided on the silicon-based substrate 12, a buffer layer 16 provided on the initial layer 15, and an operation layer 22 provided on the buffer layer 16.

The operation layer 22 has a channel layer 19 and a barrier layer 20 provided on the channel layer 19.

The first portion 14 on the front surface side of the silicon-based substrate 12 has impurity concentration lower than that in the second portion 13 on the inner side of the silicon-based substrate, this first portion has a thickness that is 1 μm or more and 10 μm or less, the impurity concentration in this first portion is gradually reduced toward the front surface, and the impurity concentration in this first portion is $1\times10^{14}$ atoms/cm$^3$ or more and less than $1\times10^{19}$ atoms/cm$^3$.

The semiconductor device 11 further has a first electrode 26, a second electrode 28, and a control electrode 30 provided on the operation layer 22.

In the semiconductor device 11, the first electrode 26 and the second electrode 28 are arranged such that an electric current can flow from the first electrode 26 to the second electrode 28 through a two-dimensional electron gas 24 famed in the channel layer 19.

The electric current flowing between the first electrode 26 and the second electrode 28 can be controlled by an electric potential applied to the control electrode 30.

Furthermore, the buffer layer 16 has a multilayer structure in which a first layer 17 and a second layer 18 having a composition different from that of the first layer 17 are alternately stacked.

Moreover, the initial layer 15, the buffer layer 16, and the operation layer 22 constitute a nitride compound semiconductor layer 25.

It is to be noted that the silicon-based substrate 12 shown in FIG. 1(a) is used as the silicon-based substrate in the above described, but the silicon-based substrate 12' shown in FIG. 1(b) can be used as the silicon-based substrate.

In the semiconductor device 11, likewise, the crystallinity of the nitride compound semiconductor layer famed on the upper side of the substrate can be excellently maintained while improving a warpage of the substrate.

A method for manufacturing a semiconductor device according to the present invention will now be described.

First, a silicon-based substrate is fabricated. Specifically, the silicon-based substrate 12 shown in FIG. 1(a) or the silicon-based substrate 12' shown in FIG. 1(b) is fabricated.

In case of fabricating the silicon-based substrate 12 shown in FIG. 1(a), for example, a silicon single-crystal ingot having the second impurity concentration is fabricated by a CZ method, this ingot is sliced and subjected to surface processing to prepare a silicon-based substrate having the second impurity concentration as a whole, and then a silicon-based semiconductor layer having the first impurity concentration lower than the second impurity concentration can be epitaxially grown on this silicon-based substrate, thereby fabrication of the silicon-based substrate 12 can be carried out.

The first impurity concentration can be controlled based on concentration of a dopant gas introduced during the epitaxial growth. Additionally, a thickness of the first portion 14 can be controlled by adjusting a thickness of the epitaxial layer to be grown.

In case of fabricating the silicon-based substrate 12' shown in FIG. 1(b), a silicon-based substrate having the second impurity concentration as a whole fabricated similarly to the above-described method is prepared, and a thermal treatment is given to this silicon-based substrate to outwardly diffuse impurities in a substrate surface, thereby the fabrication of the silicon-based substrate 12' can be carried out.

The first impurity concentration and a thickness of the first portion 14' can be controlled by adjusting a temperature and a time of the thermal treatment that effects the out diffusion.

As described above, it is possible to fabricate the silicon-based substrate that has the first portion provided on the front surface side having the first impurity concentration and the second portion having the second impurity concentration higher than the first impurity concentration and provided on the inner side of the first portion, and in which the first impurity concentration is $1\times10^{14}$ atoms/cm$^3$ or more and less than $1\times10^{19}$ atoms/cm$^3$, and the thickness of the second portion is larger than the thickness of the first portion.

Although manufacture of a semiconductor device using the silicon-based substrate 12 will be described hereinafter, but the manufacture can be likewise performed when the silicon-based substrate 12' is used.

Then, the initial layer 15 is formed on the silicon-based substrate 12. Specifically, the initial layer 15 made of AlN is grown 10 to 300 nm by an MOVPE (metal organic vapor phase epitaxy) method.

Then, the buffer layer 16 is formed on the initial layer 15. Specifically, a first layer 17 made of AlN and a second layer 18 made of GaN are alternately grown by the MOVPE method. A film thickness of the first layer 17 is, e.g., 3 to 7 nm, and a film thickness of the second layer 18 is, e.g., 2 to 7 nm. This process is repeated for, e.g., 1 to 15 times.

Then, the operation layer 22 is formed on the buffer layer 16. Specifically, the channel layer 19 made of GaN and a barrier layer 20 made of AlGaN are sequentially grown on the buffer layer 16 by the MOVPE method. A film thickness of the channel layer 19 is, e.g., 1000 to 4000 nm, and a film thickness of the barrier layer 20 is, e.g., 10 to 50 nm.

Subsequently, the first electrode 26, the second electrode 28, and the control electrode 30 are formed on the barrier layer 20. Each of the first electrode 26 and the second electrode 28 can be formed of, e.g., a stacked film of Ti/Al, and the control electrode 30 can be famed of a stacked film consisting of a lower film made of a metal oxide such as SiO or SiN and an upper film made of a metal such as Ni, Au, Mo, or Pt.

The semiconductor device 11 shown in FIG. 2 can be obtained by the above-described manufacturing method.

EXAMPLES

The present invention will now be more specifically described hereinafter based on an example and comparative examples, but the present invention is not restricted thereto.

Example 1

As a silicon-based substrate, a silicon substrate 12 in which a first portion 14 has boron concentration of $3\times10^{18}$ atoms/cm$^3$ and a second portion 13 has boron concentration of $2\times10^{19}$ atoms/cm$^3$ was used, and a semiconductor device was fabricated by the above-described method.

In regard to the semiconductor device according to Example 1, crystallinity of a nitride compound semiconductor layer as an upper layer and an amount of warpage of the substrate were measured.

Figure 4:
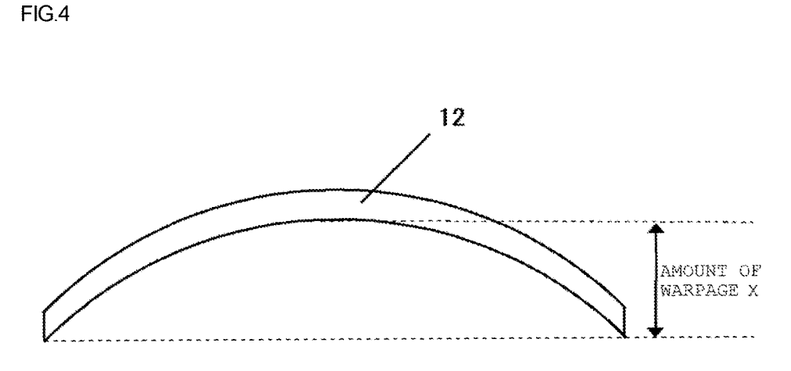
FIG. 4 is a view showing a definition of the amount of warpage of the substrate.

It is to be noted that the crystallinity was measured with the use of a full-width at half maximum (arcsec) of a peak waveform of XRD (X-ray diffraction). Further, as to the amount of warpage of the substrate, as shown in FIG. 4, a difference between a height of a central portion of the substrate and a height of the outermost periphery of the substrate was defined as an amount of warpage x. Here, warping convexly means warping to raise the central portion of the substrate as shown in FIG. 4 when the nitride compound semiconductor layer is arranged to face upward.

Table 1 shows a measurement result.

Comparative Example 1

A semiconductor device was fabricated similarly to Example 1. However, as a silicon-based substrate, a single-layer silicon substrate having boron concentration of $2\times10^{19}$ atoms/cm$^3$ was used.

In regard to the semiconductor device according to Comparative Example 1, similarly to Example 1, crystallinity of a nitride compound semiconductor layer as an upper layer and an amount of warpage of the substrate were measured.

Table 1 shows a measurement result.

Comparative Example 2

A semiconductor device was fabricated similarly to Example 1. However, as a silicon-based substrate, a single-layer silicon substrate having boron concentration of $3\times10^{18}$ atoms/cm$^3$ was used.

In regard to the semiconductor device according to Comparative Example 2, similarly to Example 1, crystallinity of a nitride compound semiconductor layer as an upper layer and an amount of warpage of the substrate were measured.

Table 1 shows a measurement result.

TABLE 1

| | Substrate bulk boron concentration [atoms/cm$^3$] | Substrate surface boron concentration [atoms/cm$^3$] | Crystallinity of semiconductor layer as an upper layer [arcsec]* | Amount of warpage of substrate |
|---|---|---|---|---|
| Example 1 | $2 \times 10^{19}$ | $3 \times 10^{18}$ | 560 | 10 to 50 µm convexly |
| Comparative Example 1 | $2 \times 10^{19}$ | $2 \times 10^{19}$ | 700 | 10 to 50 µm convexly |
| Comparative Example 2 | $3 \times 10^{18}$ | $3 \times 10^{18}$ | 560 | 10 to 200 µm convexly |

*a full-width at half maximum of a peak waveform of XRD (X-ray diffraction)

As can be understood from Table 1, in Comparative Example 1 in which the boron concentration in the substrate is high as a whole, a variation in amount of warpage of the substrate is reduced, but, on the other hand, the crystallinity of the nitride compound semiconductor layer as the upper layer is degraded (a larger half value width of XRD represents poor crystallinity).

Further, in Comparative Example 2 in which the boron concentration in the substrate is low as a whole, the crystallinity of the nitride compound semiconductor layer as the upper layer is excellent but, on the other hand, a variation in amount of warpage of the substrate is large.

As compared with the above description, in Example 1, a variation in amount of warpage of the substrate is reduced, and the crystallinity of the nitride compound semiconductor layer as the upper layer is excellently maintained.

Referring to FIG. 3 in which the result in Table 1 is reflected, it can be understood that both of a reduction in variation in amount of warpage of the substrate and an improvement in crystallinity of the nitride compound semiconductor layer as the upper layer cannot be achieved in Comparative Example 1 and Comparative Example 2 of the single-layer structure, but both of the reduction in amount of warpage of the substrate and the improvement in crystallinity of the nitride compound semiconductor layer can be achieved in Example 1.

It is to be noted that the present invention is not restricted to the foregoing embodiment. The foregoing embodiment is an illustrated example, and any example that has substantially the same configuration and exercises the same functions and effects as the technical concept described in claims of the present invention is included in the technical scope of the present invention.

The invention claimed is:

1. A method for manufacturing a semiconductor device, comprising:
    fabricating a silicon-based substrate having a first portion provided on a front surface side which has a first impurity concentration and a second portion provided on an inner side of the first portion which has a second impurity concentration higher than the first impurity concentration, the first impurity concentration being $1\times10^{14}$ atoms/cm$^3$ or more and less than $1\times10^{19}$ atoms/cm$^3$, and a thickness of the second portion being larger than a thickness of the first portion; and
    forming a nitride compound semiconductor layer which is on the front surface of the silicon-based substrate,
    wherein a thickness of the first portion is set to be 1 µm or more and 10 µm or less, and
    the first impurity concentration is gradually reduced from the second portion toward the surface of the first portion; and
    wherein the step of fabricating the silicon-based substrate comprises:
    a stage of preparing the silicon-based substrate having the second impurity concentration as a whole; and a stage of giving a thermal treatment to the silicon-based substrate to outwardly diffuse an impurity in a substrate surface.

2. The method for manufacturing a semiconductor device according to claim 1,
wherein the second impurity concentration is set to be $1\times10^{19}$ atoms/cm$^3$ or more and $1\times10^{20}$ atoms/cm$^3$ or less.

3. The method for manufacturing a semiconductor device according to claim 2,
wherein the step of fabricating the silicon-based substrate comprises:
a stage of forming a silicon-based semiconductor layer having the first impurity concentration on the silicon-based substrate by epitaxial growth.

4. The method for manufacturing a semiconductor device according to claim 3,
wherein, as the impurity, any one or more of boron, phosphorous, aluminum, gallium, arsenic, nitrogen, oxygen, and carbon is used.

5. The method for manufacturing a semiconductor device according to claim 2,
wherein, as the impurity, any one or more of boron, phosphorous, aluminum, gallium, arsenic, nitrogen, oxygen, and carbon is used.

6. The method for manufacturing a semiconductor device according to claim 1,
wherein the step of fabricating the silicon-based substrate comprises:
a stage of forming a silicon-based semiconductor layer having the first impurity concentration on the silicon-based substrate by epitaxial growth.

7. The method for manufacturing a semiconductor device according to claim 6,
wherein, as the impurity, any one or more of boron, phosphorous, aluminum, gallium, arsenic, nitrogen, oxygen, and carbon is used.

8. The method for manufacturing a semiconductor device according to claim 1,
wherein, as the impurity, any one or more of boron, phosphorous, aluminum, gallium, arsenic, nitrogen, oxygen, and carbon is used.

* * * * *